United States Patent [19]
Parkhurst

[11] Patent Number: 6,084,457
[45] Date of Patent: *Jul. 4, 2000

[54] METHOD AND APPARATUS FOR CLAMPING A HIGH-SPEED DIGITAL SIGNAL DELIVERED OVER A TRANSMISSION LINE

[75] Inventor: Jeff Parkhurst, El Dorado Hills, Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/982,087

[22] Filed: Dec. 1, 1997

[51] Int. Cl.⁷ ..................................................... H03K 5/08
[52] U.S. Cl. ........................... 327/310; 327/321; 327/112; 326/23; 326/30
[58] Field of Search ..................................... 327/309, 310, 327/312, 313, 321, 327, 328, 379, 318, 391, 108–112; 326/21–26, 30, 33, 34

[56] References Cited

U.S. PATENT DOCUMENTS

| | | | |
|---|---|---|---|
| 5,436,584 | 7/1995 | Bodas et al. | 327/310 |
| 5,528,190 | 6/1996 | Honnigford | 327/328 |
| 5,561,391 | 10/1996 | Wellnitz et al. | 327/309 |

*Primary Examiner*—Timothy P. Callahan
*Assistant Examiner*—Minh Nguyen
*Attorney, Agent, or Firm*—Blakely, Sokoloff, Taylor & Zafman LLP

[57] ABSTRACT

A clamping circuit useful in reducing ringing on a transmission line is described. The clamping circuit includes a pair of transistors coupled between the transmission line and opposite terminals of a voltage source. An enable circuit monitors the transmission line for transitions, both low-to-high and high-to-low, and enables the transistors to be biased such that they connect the transmission line to the voltage source in the presence of ringing.

13 Claims, 5 Drawing Sheets ated in FIG. 1 by a waveform that transitions between low and high values without distortion. In the real world, a variety of factors affect and undesirably distort the waveform from the idealized representation of FIG. 1. For example, digital signals communicated over even relatively short transmission lines can be severely impacted by "ringing." Ringing is defined as a damped oscillation occurring in the signal as a result of a sudden change in the signal. Thus, as shown in FIG. 2, transitions in the digital waveform from low-to-high and high-to-low produce a damped oscillation immediately following the transition. In high frequency digital waveforms, the damped oscillation can last for a substantial period of the signal.

METHOD AND APPARATUS FOR CLAMPING A HIGH-SPEED DIGITAL SIGNAL DELIVERED OVER A TRANSMISSION LINE

BACKGROUND OF THE INVENTION

1. Field of the Invention

This invention relates generally to interfacing electrical components, and, more particularly, to a high-speed clamping circuit.

2. Description of the Related Art

In the field of electronics, information is commonly communicated using digital waveforms, which are ideally represented in FIG. 1 by a waveform that transitions between low and high values without distortion. In the real world, a variety of factors affect and undesirably distort the waveform from the idealized representation of FIG. 1. For example, digital signals communicated over even relatively short transmission lines can be severely impacted by "ringing." Ringing is defined as a damped oscillation occurring in the signal as a result of a sudden change in the signal. Thus, as shown in FIG. 2, transitions in the digital waveform from low-to-high and high-to-low produce a damped oscillation immediately following the transition. In high frequency digital waveforms, the damped oscillation can last for a substantial period of the signal.

These damped oscillations in the waveform are generally undesirable because they reduce the speed of operation of the overall circuit. That is, no assurances can be given as to what the value of the digital signal will be during this damped oscillatory period, owing to the relatively large transitions in the digital waveform. Thus, if the damped oscillations are not removed from the digital waveform, then any circuitry receiving the digital waveform must wait a preselected period of time to ensure that the damped oscillations have died out sufficiently so as not to affect the value of the digital signal observed. This waiting is, of course, undesirable in that it slows the overall operation of the circuit.

Prior art devices have attempted to reduce the damped oscillations by providing a circuit to clamp the transmission line to the desired high and low levels in response to a transition in the input wave form. These circuits have suffered from at least one significant shortcoming. These circuits tend to be slow to operate, and for high frequency digital signals, slow operation of the clamping circuit may allow the most significant portion of the damped oscillation to occur before the clamping circuitry takes effect. The slow response of the clamping circuit increases the time required to stabilize the input waveform and remove the damped oscillations, slowing the operation of the overall circuit.

The present invention is directed to overcoming, or at least reducing the effects of, one or more of the problems set forth above.

SUMMARY OF THE INVENTION

In one aspect of the present invention, an apparatus is provided for clamping a circuit. The apparatus comprises an enable circuit to receive a first signal transmitted over a transmission line and deliver an enable signal in response to a first transition in the first signal and for a preselected duration of time after a second transition in the first signal. A transistor has an enable input and is adapted to be coupled between a voltage supply and the transmission line. A bias circuit is coupled to receive the enable signal and provide a signal to the enable input of the transistor to bias the transistor at a first preselected voltage level in response to receiving the enable signal.

In another aspect of the instant invention, a method is provided for reducing ringing of a signal delivered over a transmission line. The method comprises detecting a first transition from a first voltage level to a second voltage level in a signal delivered over the transmission line; coupling a first voltage source to the transmission line in response to detecting the transition; detecting a second transition from the second voltage level to the first voltage level in the signal delivered over the transmission line; and uncoupling the first voltage source from the transmission line a first preselected period of time after detecting the second transition.

BRIEF DESCRIPTION OF THE DRAWINGS

Other objects and advantages of the invention will become apparent upon reading the following detailed description and upon reference to the drawings in which.

Figure 1:
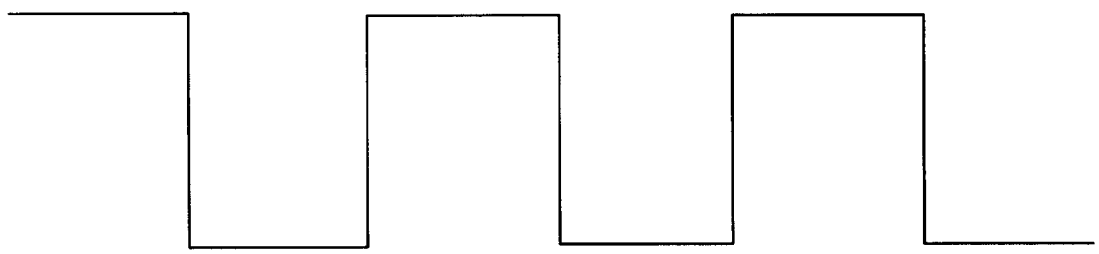
FIG. 1 is a stylized representation of a digital waveform.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3:
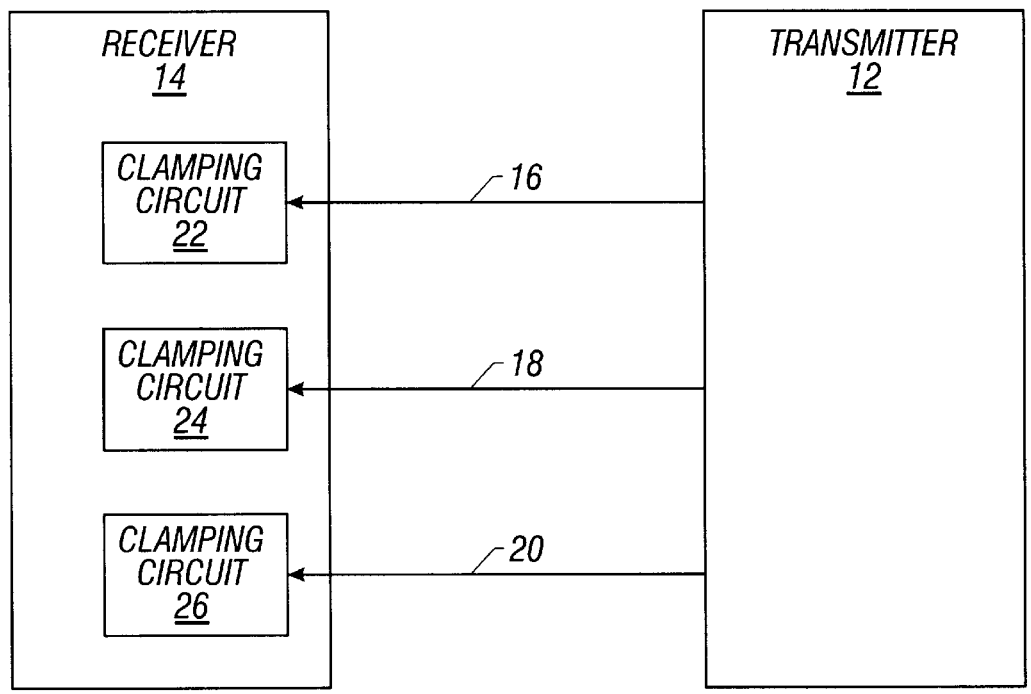
FIG. 3 is a block diagram of one embodiment of an electrical system.

Turning now to the drawings, and in particular to FIG. 3, a block diagram of an electronic system 10 is shown. The electronic system 10 includes a transmitter 12 and a receiver 14 interconnected by a plurality of transmission lines 16, 18, 20. The transmission lines 16, 18, 20 are connected to clamping circuits 22, 24, 26, respectively, within the receiver 14. The transmission lines 16, 18, 20 can take on a variety of forms, including but not limited to, cables, wires, tracks on a printed circuit board, metal or semiconductor lines within a semiconductor chip, etc.

Figure 4:
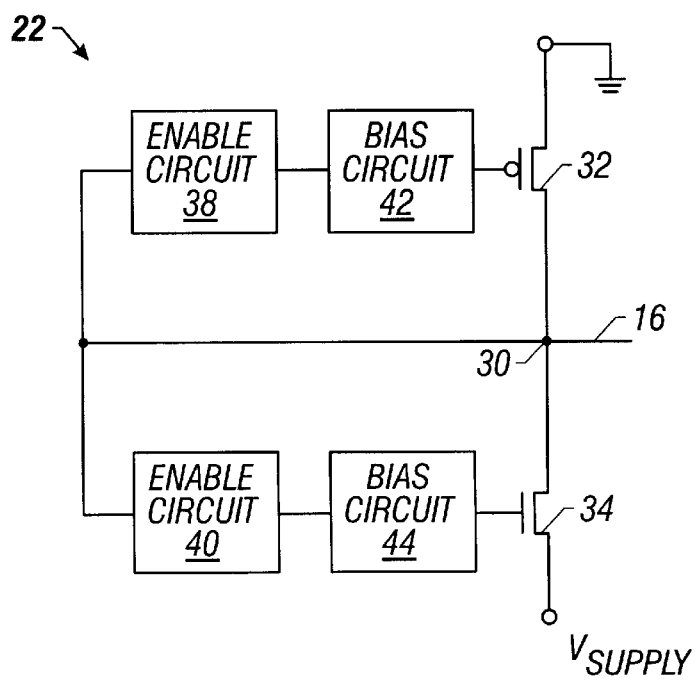
FIG. 4 is a stylized diagram of one embodiment of a clamping circuit used in an electrical system of the type shown in FIG. 3.

One embodiment of the clamping circuit 22 is illustrated in block diagram form in FIG. 4. The transmission line 16 is connected to a node 30 located between a pair of transistors 32, 34, which are serially connected between a pair of voltage potentials, $V_{supply}$ and ground. The node 30 is also connected to a pair of enable circuits 38, 40. The enable circuits 38, 40 are respectively connected to bias circuits 42, 44, which in turn are connected to the enable inputs of the transistors 32, 34.

Figure 2:
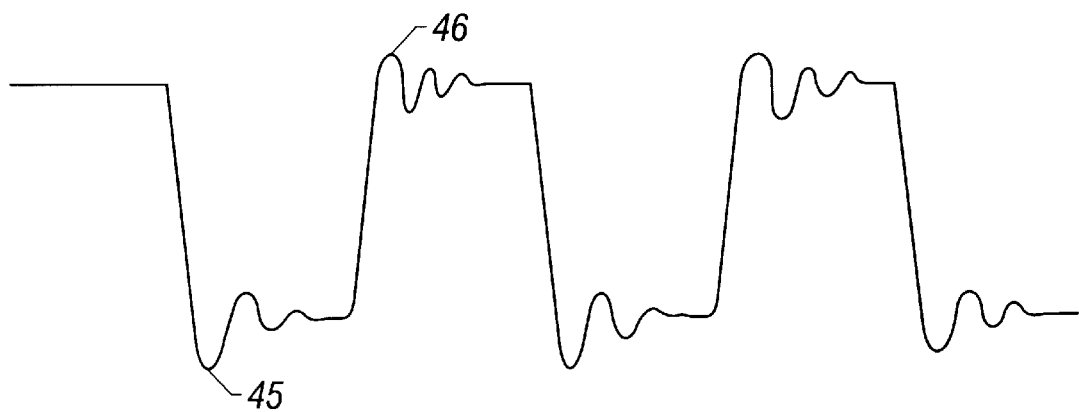
FIG. 2 is a representation of a digital waveform affected by ringing.
Figure 6:
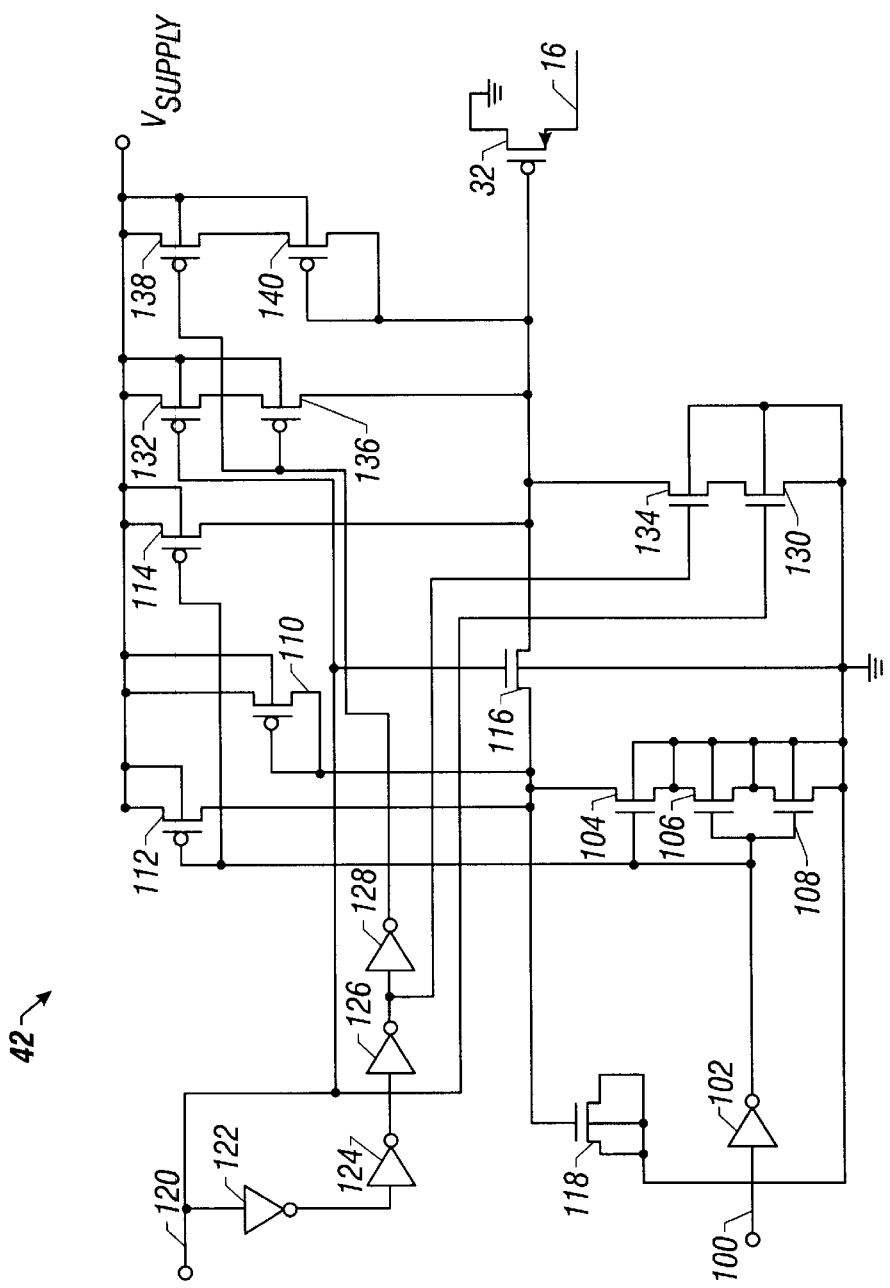

During normal operation of the clamping circuit 22, a transition in the waveform of a signal on the transmission line 16 is detected by the enable circuits 38, 40. The bias circuit 42 is configured to enable, or turn "on" the transistor 32 so that ground is connected to the transmission line 16 during a low-to-high transition of the digital signal on the transmission line 16. When the transistor 32 is biased "on," the transmission line 16 is pulled toward ground to counteract the overshoot 46 (see FIG. 2) brought on by the ringing present on the transmission line 16. In one embodiment, the enable circuit 38 and bias circuit 42 bias the transistor 32 "on" in response to detecting a high-to-low transition and then holds the transistor 32 "on" for a preselected period of time after the waveform on the transmission line 16 experiences a subsequent low-to-high transition. One example of an embodiment is shown in FIG. 6 and is discussed in greater detail below.

The period of time that the transistor 32 is biased "on" depends on a number of factors, including the length of the transmission line 16 and the size of the transistor 32. For example, in an embodiment where the length of the transmission line is 1 cm, the size of the transistor is approximately 220/0.6, the preselected period of time for the embodiment illustrated in FIG. 5 was selected to be in the range of 10 nanoseconds.

The enable circuit 40, the bias circuit 44, and the transistor 34 operate in a manner similar to that described above with respect to the enable circuit 38, the bias circuit 42, and the transistor 32, except that the enable circuit 40 and the bias circuit 44 bias the transistor 34 "on" in response to a low-to-high transition of the waveform on the transmission line 16, and hold the transistor 34 "on" for a preselected period of time after a subsequent high-to-low transition of the waveform on the transmission line 16. Additionally, the enable circuit 40 need not hold the transistor 34 "on" for the same period as that of the enable circuit 38. Rather, the periods associated with the enable circuits 38, 40 are selected to optimize the performance of the clamping circuit 22 for both high-to-low and low-to-high transitions.

Figure 5:
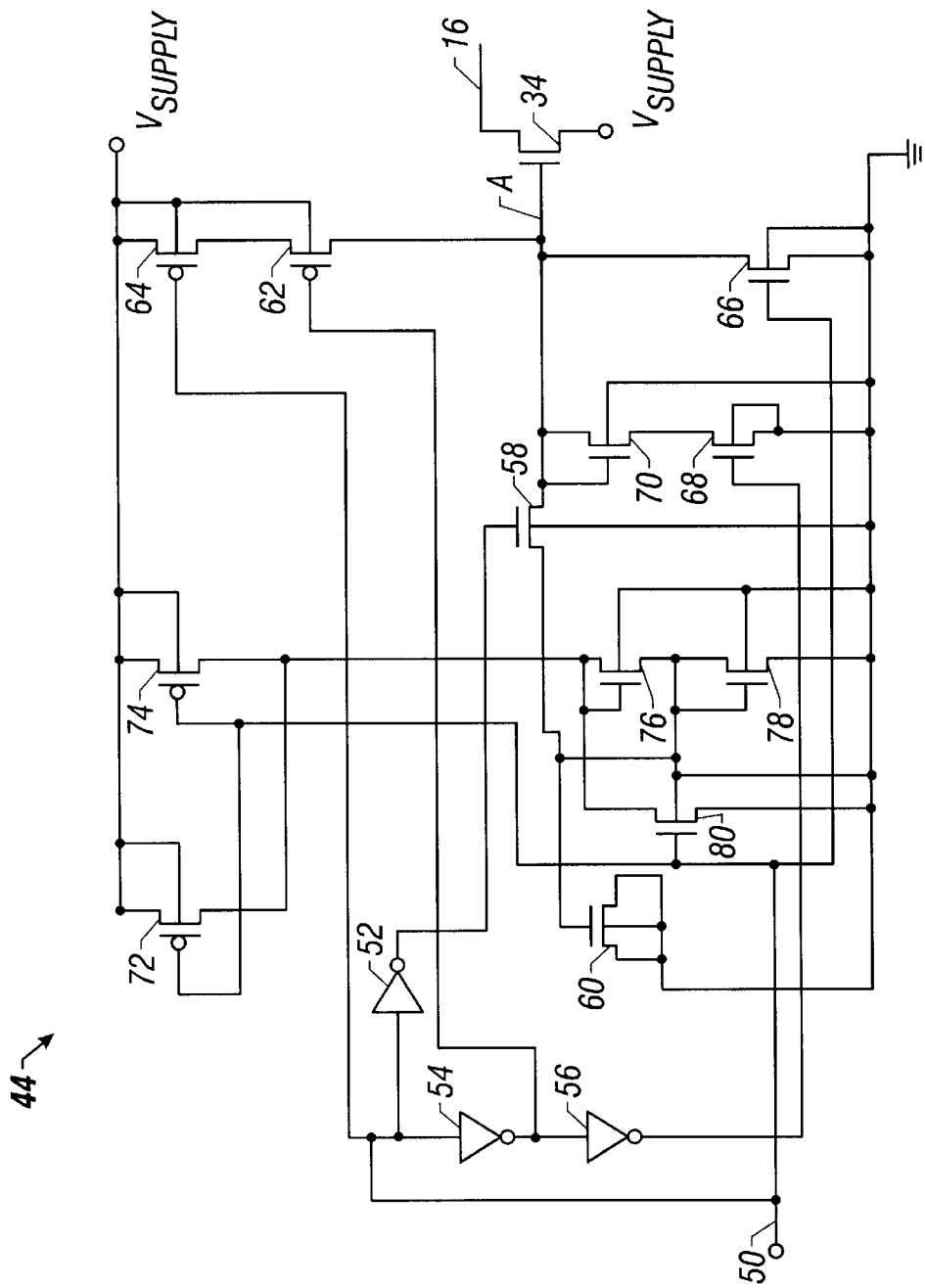
FIGS. 5 and 6 are schematic diagrams of embodiments of the bias circuits of FIG. 4.

Turning now to FIG. 5, a schematic diagram of one embodiment of the bias circuit 44 is illustrated. The output of the enable circuit 40 is connected over a line 50 through a series of inverters 52, 54, 56. The output of the first inverter 52 is connected to the gate of an NMOS transistor 58, which is connected between the gate of the NMOS transistor 34 and a transistor 60 configured as a capacitor. The output of the inverter 54 is connected to the gate of a PMOS transistor 62, which is coupled between the gate of the NMOS transistor 34 and the voltage source $V_{supply}$ through a PMOS transistor 64. The gate of the PMOS transistor 64 is connected to the line 50. The line 50 is also connected to the gate of an NMOS transistor 66, which is coupled between the gate of the NMOS transistor 34 and ground. The output of the inverter 56 is coupled to the gate of an NMOS transistor 68, which is coupled between ground and the gate of the NMOS transistor 34 through a transistor 70 configured as a diode.

The line 50 is also connected to the gates of a pair of parallel connected PMOS transistors 72, 74, which are connected between the voltage source $V_{supply}$ and ground through a pair of serially connected NMOS transistors, 76, 78, which are configured as diodes. The line 50 is also connected to the gate of an NMOS transistor 80 connected in parallel with the NMOS transistors 76, 78. It should be appreciated that the logical devices shown in the various figures operate off of a voltage supply $V_{cc}$ separate from the voltage supply $V_{supply}$. In one embodiment, the voltage supply $V_{cc}$ is selected to be 3.3 V, and the voltage supply $V_{supply}$ is selected to be 1.5 V.

During normal operation of the bias circuit 44, a logically high signal on the input line 50 disables the bias circuit 44, biasing the NMOS transistor 34 "off." A logically high signal on the input line 50 biases the NMOS transistor 66 "on," pulling the gate of the NMOS transistor 34 to ground and biasing the NMOS transistor 34 "off." Additionally, the logically high signal on the input line 50 is also delivered to the gate of the PMOS transistors 64, 72, 74 thereby biasing these transistors "off" and isolating the voltage source $V_{supply}$ from the gate of the NMOS transistor 34. The inverter 54 responds to the logically high signal on the input line 50 by delivering a logically low signal to the gate of the PMOS transistor 62, biasing the transistor 62 "on." However, because the PMOS transistor 64 is biased "off," the voltage source $V_{supply}$ remains isolated from the gate of the NMOS transistor 34.

For a short period of time after the signal on the input line 50 transitions to a logically low value, both the input and output to the inverter 54 will be logically low, biasing both of the PMOS transistors 62, 64 "on." At the same time, the logically low value on the input line 50 drives the NMOS transistor 66 "off," isolating the gate of the transistor 34 from ground. Thus, the voltage source $V_{supply}$ is connected to the gate of the NMOS transistor 34 through the transistors 64, 62, biasing the NMOS transistor 34 "on" if the voltage level on the line 16 falls more than a threshold voltage level below the bias voltage $V_a$. Additionally, the transistor 58 is biased "on" by a high output from the inverter 52, thereby providing a direct path for current to flow from the voltage source $V_{supply}$ through the transistor 64, 62, 58 to the capacitor 60. This path for charging the capacitor 60 exists only momentarily, during the transition time of the inverter 54, but is sufficiently long to quickly boost the voltage on the capacitor 60 to its desired level. Thereafter, the output of the inverter 54 transitions to a logically high state, biasing the PMOS transistor 62 "off," isolating the capacitor 60 from the voltage source $V_{supply}$. The voltage stored on the capacitor 60, however, is sufficient to bias the NMOS transistor 34 "on," and is maintained at this level while the signal on the input line 50 is logically low by a circuit comprising the transistors 72, 74, 76, 78.

A logically low signal on the input line 50 biases the PMOS transistors 72, 74 "on," allowing current to flow from the voltage source $V_{supply}$ through the parallel connected PMOS transistors 72, 74 and through the series connected diodes 76, 78. The capacitor 60 is connected in parallel with the diode 78 so that the capacitor 60 is maintained at a voltage substantially equivalent to the threshold voltage $V_{th}$ of the transistor 78. Therefore, the gate of the NMOS transistor 34 is maintained at about the threshold voltage $V_{th}$ during the time period when the input line 50 is at a logically low state. Thus, the transistor 34 will be biased "on" when the voltage at its drain (on the transmission line 16) falls more than $V_{th}$ below its gate voltage, i.e., about zero volts. In other words, when ringing on the transmission line 16 causes the voltage on the transmission line 16 to dip below zero volts, then the bias circuit 44 biases the NMOS transistor 34 "on," pulling the voltage level on the transmission line 16 back toward $V_{supply}$, reducing ringing.

The bias circuit 44 responds to a logically low signal on the input line 50 by charging the capacitor 60 to its desired voltage level very quickly using the path from the voltage source $V_{supply}$ through the transistors 64, 62, 58, and thereafter maintains the voltage level on the capacitor 60 at the threshold voltage $V_{th}$ using the path from the voltage source $V_{supply}$ through the transistors 72, 74 and the diodes 76, 78. Allowing the capacitor 60 to be charged in response to a low-to-high transition on the transmission line 16 insures that the bias circuit 44 is ready to respond immediately if ringing occurs during a subsequent high-to-low transition. Moreover, enabling the bias circuit 44 "early" does not adversely impact quiescent current because the transistor 34 will only be biased "on" once the voltage level on the transmission line 16 falls below ground, which should not occur until the subsequent high-to-low transition.

Turning now to FIG. 6, a schematic diagram of one embodiment of the bias circuit 42 is illustrated. An enable signal is connected over a line 100 through an inverter 102. The output of the inverter 102 is connected to the gates of NMOS transistors 104, 106, 108, which are connected in series between ground and the voltage supply $V_{supply}$ through a PMOS transistor 110 connected as a diode. The output of the inverter 102 is also connected to the gates of a pair of PMOS transistors 112, 114, which are connected at one terminal to the voltage source $V_{supply}$ and at their other terminal to opposite terminals of an NMOS transistor 116. An NMOS transistor 118, which is connected as a capacitor, is coupled between ground and one terminal of the NMOS transistor 116. The other terminal of the NMOS transistor is connected to the gate of the PMOS transistor 32.

The enable signal applied to the line 100 is used to enable/disable the bias circuit 42. When the enable signal 100 is logically high, the PMOS transistors 114, 112 are biased "on," which pulls the gate of the PMOS transistor 32 to a logically high level, biasing the PMOS transistor 32 "off." Additionally, the transistors 108, 104, 106, are biased "off," negating any current path to ground when the circuit is in this state. When the control signal on the line 100 is logically low, the PMOS transistors 112, 114 are biased "off," allowing the voltage level at the gate of the PMOS transistor 32 to be controlled by the remaining portion of the bias circuit 42, as discussed below.

The output terminal of the enable circuit 38 is connected over a line 120 to the gate of the NMOS transistor 116 and to a series of four inverters 122, 124, 126, 128. The line 120 is also connected to the gate of an NMOS transistor 130 and the gate of a PMOS transistor 132. The output of the inverter 126 is connected to the gate of a NMOS transistor 134, which is connected in series with the NMOS transistor 130 between the gate of the PMOS transistor 32 and ground. The output of the inverter 128 is connected to the gate of a PMOS transistor 136, which is connected in series with the PMOS transistor 132 between the voltage source $V_{supply}$ and the gate of the PMOS transistor 32. The output of the inverter 128 is also connected to the gate of a PMOS transistor 138, which is connected in series with a PMOS transistor 140 configured as a diode between the voltage source $V_{supply}$ and the gate of the PMOS transistor 32.

During normal operation, assume that the signal delivered by the enable circuit 38 over the line 120 has just completed a logically low-to-high transition. A logically high signal on the line 120 is communicated immediately to the NMOS transistor 130, biasing it "on." At the same time, since the signal on the line 120 has just transitioned from a low-to-high state, the output of the inverter 126 will remain at a logically high level until the change in the input signal on the line 120 can propagate through the serially connected inverters 122, 124, 126. This logically high signal from the inverter 126 biases the NMOS transistor 134 "on," thereby connecting the gate of the PMOS transistor 32 to ground through the transistors 130, 134. Likewise, the output of the inverter 128 will remain in a logically low state until the logically high signal on the input line 120 propagates through the inverters 122, 124, 126, 128. The logically low signal at the output of the inverter 128 biases the PMOS transistor 138 "on," connecting the voltage source $V_{supply}$ to the gate of the PMOS transistor 32. Thus, current is free to flow through the path from the voltage source $V_{supply}$ through the transistors 138, 140, 134, 130 to ground, quickly pulling the gate of the PMOS transistor 32 to a threshold voltage below $V_{supply}$ and biasing it "on" if the voltage on the transmission line 16 is greater than $V_{supply}$. Additionally, with the input signal on the line 120 at a logically high level, the NMOS transistor 116 is biased "on," allowing current to flow from the capacitor through the transistors 134, 130 to ground, discharging the capacitor 118 to about $V_{supply}-V_{th}$.

After the logically high signal on the input line 120 is passed through the series of inverters 122, 124, 126, 128, the resulting logically high signal at the output of the inverter 128 biases the transistor 138 "off," ceasing the flow of current there. Thereafter, an alternative circuit comprised of the transistors 104, 106, 108, 110 maintains the charge on the capacitor 118 at a voltage level of about one threshold voltage $V_{th}$ below the voltage source $V_{supply}$. That is, current flows from the voltage source $V_{supply}$ through the diode connected transistor 110 and then in parallel to the capacitor 118 and the transistors 104, 106, 108. Therefore, the gate of the PMOS transistor 32 is maintained at about one threshold voltage drop below the voltage source ($V_{supply}-V_{th}$) during the time period when the voltage level on the input line 120 is at a logically high state. Thus, the transistor 32 will be biased "on" when the voltage at its drain (on the transmission line 16) rises more than one $V_{th}$ above its gate voltage ($V_{supply}-V_{th}$), i.e. about $V_{supply}$. In other words, when ringing on the transmission line 16 causes the voltage on the transmission line 16 to rise above the voltage source $V_{supply}$, then the bias circuit 42 biases the PMOS transistor 32 "on," pulling the voltage level on the transmission line 16 back toward the ground potential reducing ringing.

Figure 7:
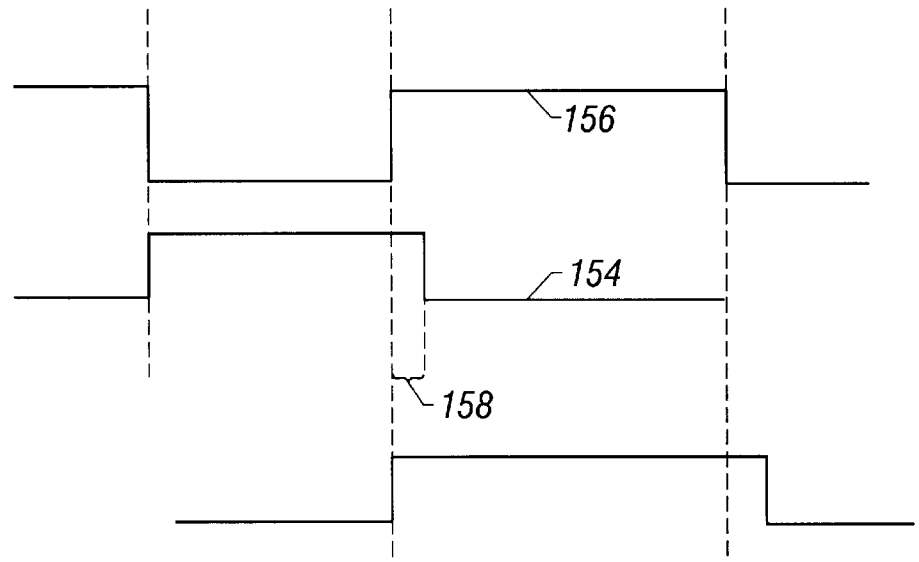
FIG. 7 is a waveform of signals associated with the circuit of FIG. 4.
Figure 8A:
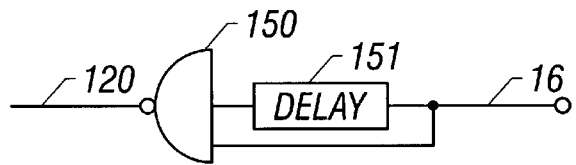
FIGS. 8A and 8B are schematic diagrams of an embodiment of an enable circuit of FIG. 4.
Figure 8B:
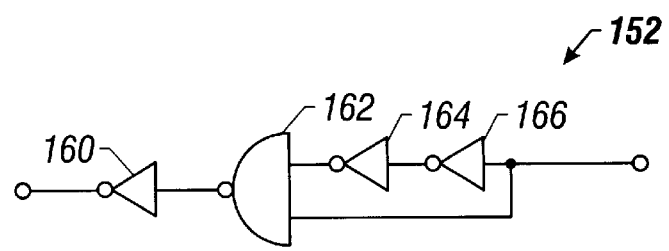

Referring now to FIGS. 8A and 8B, a schematic of one embodiment of the enable circuit 38 is disclosed. A NAND gate 150 has two inputs. The first input to the NAND gate 150 is coupled through a negative edge delay circuit 151 to the transmission line 16. The second input to the NAND gate 150 is also coupled to the transmission line 16, but receives a relatively undelayed version of any signal present on the transmission line 16. The function of the enable circuit 38 is to provide an enable signal 154 of the form shown in FIG. 7 in response to a signal on the transmission line 16. The enable signal 154 is delivered over the line 120 to the bias circuit 42, and operates to enable the bias circuit 42 to turn "on" the transistor 32 in response to a high-to-low transition of the signal 156 on the transmission line 16 until a preselected period of time 158 following a subsequent low-to-high transition.

The negative edge delay circuit 152 of FIG. 8B illustrates one embodiment of the negative edge delay circuit 151 of FIG. 8A. The circuit 152 includes an inverter 160 having its output coupled to the input of the NAND gate 150 and its input coupled to the output of a NAND gate 162. A first input of the NAND gate 162 is coupled through a pair of serially connected inverters 164, 166 to receive a signal representative of the previous value of the signal on the transmission line 16. That is, the negative edge delay circuit monitors the immediately prior state of the signal 156 on the transmission line 16. The negative edge delay circuit 152 responds to high-to-low transitions in the signal 156 by immediately passing the transition to the input of the NAND gate 150. However, the negative edge delay circuit 152 responds to low-to-high transitions of the signal 156 on the transmission line 16 by delaying the transition for a preselected period of time. That is, when the previous state of the transmission line 16 is logically low, a subsequent transition to a logically high state will result in an output from the negative edge delay circuit 152 being logically low for a preselected period of time and then transitioning to a logically high state. In the illustrated embodiment, the preselected period of time is determined by the delay induced by the propagation time of the inverters 164, 166. Various periods may be selected by varying the number or size of inverters used.

If ringing is also problematic during high-to-low transitions, then the delay circuit 40 can be constructed similar to that of the enable circuit 38 to provide an enable signal 170 of the form shown in FIG. 7 in response to the signal 156 on the transmission line 16.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A clamping circuit comprising:
    a first enable circuit coupled to receive an input signal transmitted over a transmission line and having a first enable output to deliver a first enable signal in response, said first enable signal being enabling during a first voltage level of said input signal and for a first preselected duration of time after a transition of said input signal to a second voltage level;
    a first bias circuit having:
        a first bias input coupled to said first enable output;
        a first detection circuit for detecting when said input signal transitions beyond said second voltage level; and
        a first transistor coupled between a first supply voltage level and said transmission line;
    wherein said first transistor is biased on only when said first enable signal is enabling and said first detection circuit detects said input signal transitioning beyond said second voltage level.

2. A clamping circuit, as set forth in claim 1, wherein said first voltage level is a logically low voltage level and said second voltage level is a logically high voltage level.

3. A clamping circuit, as set forth in claim 1, wherein said first voltage level is a logically high voltage level and said second voltage level is a logically low voltage level.

4. A clamping circuit, as set forth in claim 1, including:
    a second enable circuit coupled to receive the input signal over the transmission line and having a second enable output to deliver a second enable signal in response, said second enable signal being enabling during the second voltage level of said input signal and for a second preselected duration of time after a transition of said input signal to the first voltage level; and
    a second bias circuit having:
        a second bias input coupled to said second enable output; and
        a second detection circuit for detecting when said input signal transitions beyond said first voltage level;
        a second transistor coupled between a second supply voltage level and said transmission line;
    wherein said second transistor is biased on only when said second enable signal is enabling and said second detection circuit detects said input signal transitioning beyond said first voltage level.

5. A clamping circuit, as set forth in claim 1, wherein the first preselected duration of time is about 10 nanoseconds.

6. A method for reducing ringing of a signal delivered over a transmission line, comprising:
    detecting a first transition from a first voltage level to a second voltage level in a signal delivered over the transmission line;
    enabling a first biasing voltage for a first predetermined time after said first transition;
    detecting a continuation of the first transition to beyond the second voltage level; and
    applying a first opposing voltage on the transmission line to reduce said continuation of the first transition during said first predetermined time.

7. A method, as set forth in claim 6, wherein applying a first opposing voltage includes biasing an enable input of a first transistor coupled between a first voltage potential and the transmission line.

8. A method, as set forth in claim 6, wherein detecting a first transition includes detecting a transition from a logically high voltage level to a logically low voltage level.

9. A method, as set forth in claim 6, wherein detecting a first transition includes detecting a transition from a logically low voltage level to a logically high voltage level.

10. A method, as set forth in claim 6, including:
    detecting a second transition from the second voltage level to the first voltage level in the signal delivered over the transmission line;
    enabling a second biasing voltage for a second predetermined time after said second transition;
    detecting a continuation of the second transition to beyond the first voltage level; and
    applying a second opposing voltage on the transmission line to reduce said continuation of the second transition during said second predetermined time.

11. A method, as set forth in claim 10, wherein applying a second opposing voltage includes biasing an enable input of a second transistor coupled between a second voltage potential and the transmission line.

12. An electrical system, comprising:
    a transmitter;
    a receiver;
    a transmission line interconnecting said transmitter and receiver, and a clamping circuit located within said receiver and coupled to said transmission line, said clamping circuit comprising:
  a first enable circuit coupled to receive an input signal transmitted over a transmission line and deliver a first enable signal in response, said first enable signal being enabling during a first voltage level of said input signal and for a first preselected duration of time after a transition of said input signal to a second voltage level;
  a first bias circuit having:
    a first bias input coupled to said first enable circuit; and
    a first detection circuit for detecting when said input signal transitions beyond said second voltage level; and
    a first transistor coupled between a first supply voltage level and said transmission line;
  wherein said transistor is biased on only when said first enable signal is enabling and said first detection circuit detects said input signal transitioning beyond said second voltage level.

13. An electrical system, as set forth in claim 12, including:
  a second enable circuit coupled to receive the input signal over the transmission line and deliver a second enable signal in response, said second enable signal being enabling during the second voltage level of said input signal and for a second preselected duration of time after a transition of said input signal to the first voltage level; and
  a second bias circuit having:
    a second bias input coupled to said first enable output:
    a second detection circuit for detecting when said input signal transitions beyond said first voltage level:
      a second transistor coupled between a second supply voltage level and said transmission line;
  wherein said second transistor is biased on only when said second enable signal is enabling and said second detection circuit detects said input signal transitioning beyond said first voltage level.

* * * * *